(12) United States Patent
Brehm

(10) Patent No.: US 6,292,415 B1
(45) Date of Patent: Sep. 18, 2001

(54) ENHANCEMENTS IN TESTING DEVICES ON BURN-IN BOARDS

(75) Inventor: Jeffrey A. Brehm, Sunnyvale, CA (US)

(73) Assignee: Aehr Test Systems, Inc., Fremont, CA (US)

( * ) Notice: Subject to any disclaimer, the term of this patent is extended or adjusted under 35 U.S.C. 154(b) by 0 days.

(21) Appl. No.: 09/407,659

(22) Filed: Sep. 28, 1999

(51) Int. Cl.[7] .................................................. G11C 7/00
(52) U.S. Cl. ........................... 365/201; 365/194; 365/198
(58) Field of Search .................................. 365/201, 194, 365/191, 243, 198

(56) References Cited

U.S. PATENT DOCUMENTS

| | | | |
|---|---|---|---|
| 4,827,437 | * 5/1989 | Blanton | 364/571.01 |
| 5,241,264 | 8/1993 | Nishiura | 324/158 |
| 5,477,139 | * 12/1995 | West et al. | 324/158.1 |
| 5,682,472 | * 10/1997 | Brehm et al. | 395/183.01 |
| 5,794,175 | 8/1998 | Conner | 702/119 |
| 6,133,725 | * 10/2000 | Bowhers | 324/258.1 |

FOREIGN PATENT DOCUMENTS

| | | | |
|---|---|---|---|
| 43 14 324 C1 | 7/1994 | (DE) | G01R/31/28 |
| 0 574 321 A2 | 5/1993 | (EP) | H04L/25/08 |

OTHER PUBLICATIONS

Gasbarro, James A. et al., "Techniques For Characterizing DRAMS With A 500 MHZ Interface," "IEEE International Test Conference 1994," Paper 22.2, pp. 516–525.

Mydill, Marc, "A TEst System Architecture to Reduce Transmission Line Effect During High Speed Testing," "IEEE International Test Conference 1994," Paper 29.3, pp. 701–709.

Katz J.: "High Speed Testing–Have the Laws of Physics Finally Caught up with us?", International Test Conference, US, New York, NY: IEEE, vol. CONF. 29, Oct. 19, 1998, pp. 809–813, XP000822423, ISBN: 0–7803–5093–6.

(List continued on next page.)

*Primary Examiner*—David Nelms
*Assistant Examiner*—Thong Le
(74) *Attorney, Agent, or Firm*—David J. Weitj; Wilson Sonsini Goodrich & Rosati

(57) ABSTRACT

A system for testing semiconductor devices on device test boards has a single tester channel connected to multiple DUTs in a loop. Outputs from DUTs are received at a comparator and latch after a period of Round Trip Delay (RTD). The comparator is connected in a parallel configuration with the return path of the loop, where the point of connection is in greater proximity to DUT output pins than the test channel and is a path different from the tester I/O driver path, thus preventing input signals from test drivers from interfering with output signals from DUTs that will serve as inputs to test circuitry. The time it takes a new input cycle state to reach the output comparator is long after the output from a prior cycle has been tested. A diode clamp and resistor are connected in a series with the comparator at the input stage near the comparator in order to reduce ringing at the input of the comparator, which limits tester speed. Bus-switches composed of Field Effect Transistors (FET) electrically switch the input/output (I/O) of DUTs being tested to either exclusively drive or receive trace lines, respectively, reducing DUT pin loading and thus increasing achievable testing speed. The improved testing system functions in conjunction with a system designed to perform parallel test and burn-in of semiconductor devices, such as the Aehr Test MTX System. The MTX can functionally test large quantities of semiconductor devices in parallel. This system of testing provides an effective and practical method for reducing overall test cost without sacrificing quality.

20 Claims, 7 Drawing Sheets

OTHER PUBLICATIONS

Mostacciuolo A.: "Transmission Problems Encountered When Testing Memory Devices in Parallel on Memory ATE", International Test Conference 1986 Proceeding. Testing's Impact on Design and Technology (CAT. No. 86CH2339–0), Washington, DC, USA, IEEE Comput. Soc. Press., Sep. 8–11, 1986, pp. 808–818, XP002156840, ISBN: 0–8186–0726–2.

Belyeu S. M. et al: "Dynamic Burn–In System", IBM Technical Disclosure Bulletin, US, IBM Corporation, New York, vol. 22, No. 8A, 1980, pp. 3065–3068, XP002070868, ISSN: 0018–8689.

* cited by examiner

CH11 (DRIVE ONLY)  (PRIOR ART)  CH12 (RECEIVE ONLY)

ENHANCEMENTS IN TESTING DEVICES ON BURN-IN BOARDS

BACKGROUND OF THE INVENTION

1. Field of the Invention

The present invention relates to systems for and methods of testing of multiple semiconductor devices on testing boards. More specifically, it relates to more efficient methods and systems of testing semiconductor devices. Most especially, it relates to such systems and methods in which the semiconductor devices are tested in parallel and in which round trip delays in signal paths for input test signals and resulting output signals from the devices are substantially eliminated.

2. Description of the Prior Art

When fabrication of integrated circuits and other semiconductor devices, such as dynamic random access memory (DRAM) or flash memory devices, has been completed, the semiconductor devices are subjected to burn-in and electrical tests in order to identify and eliminate defective semiconductor devices before shipment to a customer. The term "burn-in" relates to operation of an integrated circuit at a predetermined temperature or temperature profile, typically an elevated temperature in an oven. Certain operating electrical bias levels and/or signals are supplied to the semiconductor devices while they are at the elevated temperature. The use of the elevated temperature accelerates stress to which the devices are subjected during burn-in, so that marginal devices that would otherwise fail shortly after being placed in service fail during burn-in and are eliminated before shipping. In electrical test, a more complete set of operating electrical bias levels and signals are supplied to the device to provide a thorough evaluation of its functions.

Commonly assigned U.S. Pat. No. 5,682,472, issued Oct. 27, 1997 to Jeffrey A. Brehm and Patrick M. Shepherd, the disclosure of which is hereby incorporated by reference herein, discloses a prior art example of a burn in method and system, which is configured to test large numbers of semiconductor devices in parallel. In one aspect of that system, different round trip delay compensation time is provided for different ones of the semiconductor devices under test (DUTs), based on different signal path lengths to the devices.

The use of such variable round trip delay compensation results in a significant performance enhancement of such a system for testing large numbers of semiconductor devices in parallel. In particular, the Assignee's commercially available MTX parallel test and burn-in system is able to operate at a test signal rate of 20 MHz as a result of using the variable round trip delay compensation. This compares to a typical burn-in test signal rate of 5 MHz for burn-in systems prior to the MTX parallel test and burn-in system.

As integrated circuit operating speeds increase, there is a corresponding increase in speed requirements for burn-in systems and methods. For example, among the highest performance memory integrated circuits are those that comply with the Rambus standard. Those memory integrated circuits operate at a signal rate of up to 800 MHz. While a parallel test and burn-in system like the MTX system cannot measure AC performance of such high frequency Rambus integrated circuits, the circuits can be operated at much lower speeds for functional testing with an MTX or similar burn-in and test system. Clearly, if the AC performance of such a highly parallel test and burn-in system can be improved, allowing higher frequency integrated circuits to be operated at higher frequencies than possible with the current MTX parallel test and burn-in system for functional testing, a higher throughput and consequently lower cost per integrated circuit functional testing is permitted. Therefore, the present invention is directed to improving such a parallel test and burn-in system to allow test signal rates of 30 MHz and higher to be achieved.

In addition to parallel test and burn-in systems for functional testing, much higher performance single head testers are known in the art and are employed for AC testing of integrated circuits. Such single head testers often incorporate a variety of features to make them operable at higher frequencies.

Such single head testers are described, for example, in M. Mydill, "A Test System Architecture to Reduce Transmission Line Effects During High Speed Testing," IEEE International Test Conference, Paper 29.3, pp. 701–709 and J. A. Gasbarro et al., "Techniques for Characterizing DRAMS with a 500 MHz Interface," IEEE International Test Conference, Paper 22.2, pp. 516–525. These papers disclose a technique for substantially eliminating round trip delay in such single head testers, but the direct application of this technique in a parallel test and burn-in system is problematical, because, as disclosed, it requires the use of two tester channels per DUT I/O pin, which reduces the efficiency of a parallel test and burn-in system by 50 percent. Further development is therefore required to allow substantial elimination of round trip delay in a parallel test and burn-in system without paying a substantial efficiency penalty in such a system.

Such a typical prior art VLSI (Very Large Scale Integration) semiconductor device single head testing system is shown in FIG. 1. VLSI refers to the placement of a large number (over 1000) of device elements, such as transistors, on integrated circuits. The Device Under Test 10 (DUT) is connected to a driver channel 12 for inputting driver signals into the DUT and a receiver channel 14 for receiving signals from the DUT that will be tested. Round Trip Delay (RTD) is a measure of the total amount of time required for a signal to propagate from one end of a trace line (the tester in FIG. 1) to the other end and back to its point of origin (the tester). In FIG. 1, RTD would be equivalent to the time required for a signal to travel from the test drive 12 to the DUT 10 and back to the receiver channel of the tester 14. Notably, neither of these channels can both drive and receive signals in this implementation. Also, this method has not been used in burn-in systems which usually have I/Os from multiple DUTs tied to one tester channel.

An existing method used to test DUTs on burn-in boards is shown in FIG. 2. A tester 20 connects to DUTs 21 to be tested at two interfaces/pins, such as 22 and 24. The tester input driver 25 connects to the DUT inputs as shown at 22, and the tester I/O driver 26 connects to the DUT I/O drivers as shown at 24. The input driver 25 produces a test signal periodically that results in correct data at the output of DUTs operating. The physical trace line length between tester drives 25 and 26 and rows of DUTs 21 may be 2–3 feet, and the propagation delay (Pd) for these traces typically ranges from 7 to 12 nanoseconds. The propagation delay resulting from the sum of the input and output lengths is referred to as Round Trip Delay (RTD) and is an important limitation on testing cycle speed in testing systems such as that shown in FIG. 2.

Tester input driver 25 typically will have more DUTs connected to it than will the tester I/O driver 26 and much better line termination. The tester I/O driver typically is connected to 8 different DUT I/O pins. All grouped DUT I/O pins receive inputs in parallel, but only one selected DUT in an I/O group is enabled at one time through multiplexing to drive the I/O line 27 for testing. The signal sent by that DUT on the I/O line 27 is inputted to a comparator 28 and a latch 29 which constitute the test logic that determines if the DUT signal sent on I/O line 27 is the proper level.

FIG. 3 shows a timing diagram illustrating how signals propagate through the testing network of FIG. 2. Each of the traces 30, 31, and 32 20 represent the signal level at the points labeled A, B, and C, respectively, in FIG. 2. Each of the vertical hash marks at the left of the traces 30, 31, and 32 denote a time of zero nanoseconds. The input to the comparator at C after 50 nanoseconds should mimic the low level outputs 34, but it does not because a new driver input signal which is seen at C is sent by the driver 26 at 50 nanoseconds, contending with delayed DUT output at C at the beginning of the next test cycle. In order for the proper low-level outputs from the DUTs to be seen at the comparator input C, the 50 nanosecond tester I/O cycle 36 must be extended by 24 nanoseconds, the Round Trip Delay 38. As a result, the input signals from the test driver do not interfere with or cancel out output signals from DUTs that will serve as inputs to test circuitry. If the cycle is not extended, only a 1 nanosecond pulse output 39 will be seen at the comparator input C.

The RTD for the prior art can be a wide range for different devices. This wide range can make it difficult to make timing measurements on the devices such as the propagation delay time or the access time. An accurate RTD time is necessary to know how much system delay to subtract off the timing measurement. There is usually some compensation within the test hardware for some fixed amount of RTD.

Moreover the DUTs' I/O drivers are the weakest current drivers in the driver chain. The weak DUT I/O driver limits maximum test speed. Furthermore, proper termination for tester I/O drivers in the input state cannot be obtained because proper input termination at DUTs generally cannot be achieved. This is because DUT output drivers cannot drive proper input termination. Tester input drivers have much stronger current delivery capability than DUT output drivers. In an attempt to partially compensate for this problem, the circuit pictured in FIG. 2 has a small series resistor positioned between the DUT and tester comparator and approximately equidistant from both.

Capacitance is added on the DUT I/O output pin as more DUT I/O pins are grouped in parallel with one another, limiting tester speeds.

Long trace lines limit tester speed. Tester I/O drivers can be moved very close to DUTs, but this results in higher costs due to increased cooling requirements. It also results in lower quantities of DUTs per cubic area that can be tested in the burn-in oven.

SUMMARY OF THE INVENTION

Accordingly, it is an object of this invention to substantially eliminate the effect of trace Round Trip Delay (RTD) on the speed at which semiconductor devices on burn-in boards can be tested.

It is a further object of the invention to increase the speed at which semiconductor devices can be tested with a parallel test and burn-in system.

It is another object of this invention to reduce the cost at which DUTs on burn-in boards can be tested.

It is an additional object of this invention to reduce the number of test channels required to test DUTs on burn-in boards.

The attainment of the foregoing and related objects may be achieved through use of the novel semiconductor device parallel test and burn-in system and method herein disclosed. In accordance with this invention, a semiconductor device parallel test and burn-in system includes a pattern generator for generating a plurality of test signals for the semiconductor devices. An interface couples a plurality of semiconductor devices in parallel to the pattern generator. A plurality of data output comparators are coupled to the interface so that one of the plurality of data output comparators can be coupled to each of said plurality of semiconductor devices. The interface and the data output comparators are coupled to substantially eliminate round trip delay.

In accordance with another aspect of the invention, a method for burn-in testing of a plurality of semiconductor devices includes providing a plurality of burn-in test signals to an input of each of the plurality of semiconductor devices. A data output comparator is coupled to an output of each of the plurality of semiconductor devices in a manner to substantially eliminate round trip delay. Data output signals are provided from each of the plurality of semiconductor devices to the data output comparator.

Through use of the system and method of this invention, a speed-enhanced system for testing semiconductors on enhanced burn-in boards can be achieved with a single tester channel connected to multiple DUTs in a loop.

The tester periodically sends test signals to the Device Test Board (DTB) containing DUTs. Outputs from the DUTs are received at test circuitry, such as a comparator and latch, for example, after a period of Round Trip Delay (RTD). This comparator is connected in a parallel configuration with the return path of the loop, where the point of connection is in greater proximity to DUT output pins than the test channel and is a path different from the tester I/O driver path. As a result, the input signals from the test driver do not interfere with or cancel out output signals from DUTs that will serve as inputs to test circuitry. Clamping circuitry such as a diode clamp and resistor, for example, is connected in series with the comparator at the input stage near the comparator in order to reduce ringing at the input of the comparator, which limits tester speed. The requirement that the clamping circuitry be near the comparator means that it should be closer to the comparator than to the output of the DUT, preferably as close as physically possible to the comparator. The output of the comparator enters a latch into which the output of the comparator and a trace RTD null signal enter. A latch is a circuit component that can "remember" an earlier input until it is cleared or the data is "requested" by another circuit.

Another aspect of the present invention is the use of bus-switches composed of Field Effect Transistors (FET) that electrically switch the input/output (I/O) of DUTs being tested to either exclusively drive or receive trace lines, respectively. The use of these switches reduces DUT pin loading because only one line is connected to each pin at time, which increases achievable testing speed.

A further aspect of the present invention consists of multiplexers that connect a single DUT output pin at a time to comparator circuitry to reduce DUT output capacitance and thus allow faster testing speeds.

The improved testing circuitry configurations desirably functions in conjunction with a system designed to perform parallel test and burn-in of devices, such as the MTX Massively Parallel Functional Test System (MTX) produced by Aehr Test Systems. The MTX can functionally test large quantities of devices in parallel; however, it only needs one pattern generator for the testing of all the devices. The unique system of two sets of latches within the recording system triggered by each device allows higher speed testing. This system of testing provides an effective and practical method for reducing overall test cost without sacrificing quality.

DETAILED DESCRIPTION OF THE INVENTION

Figure 1:
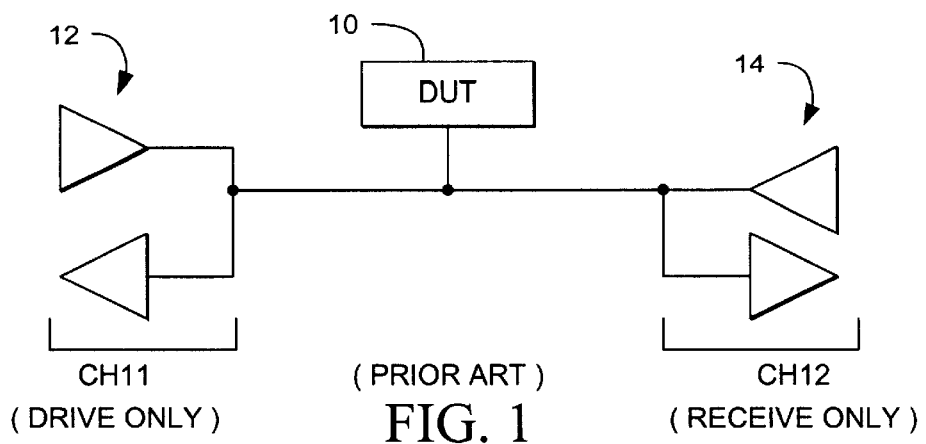
FIG. 1 illustrates a typical prior art two channel VLSI tester.
Figure 2:
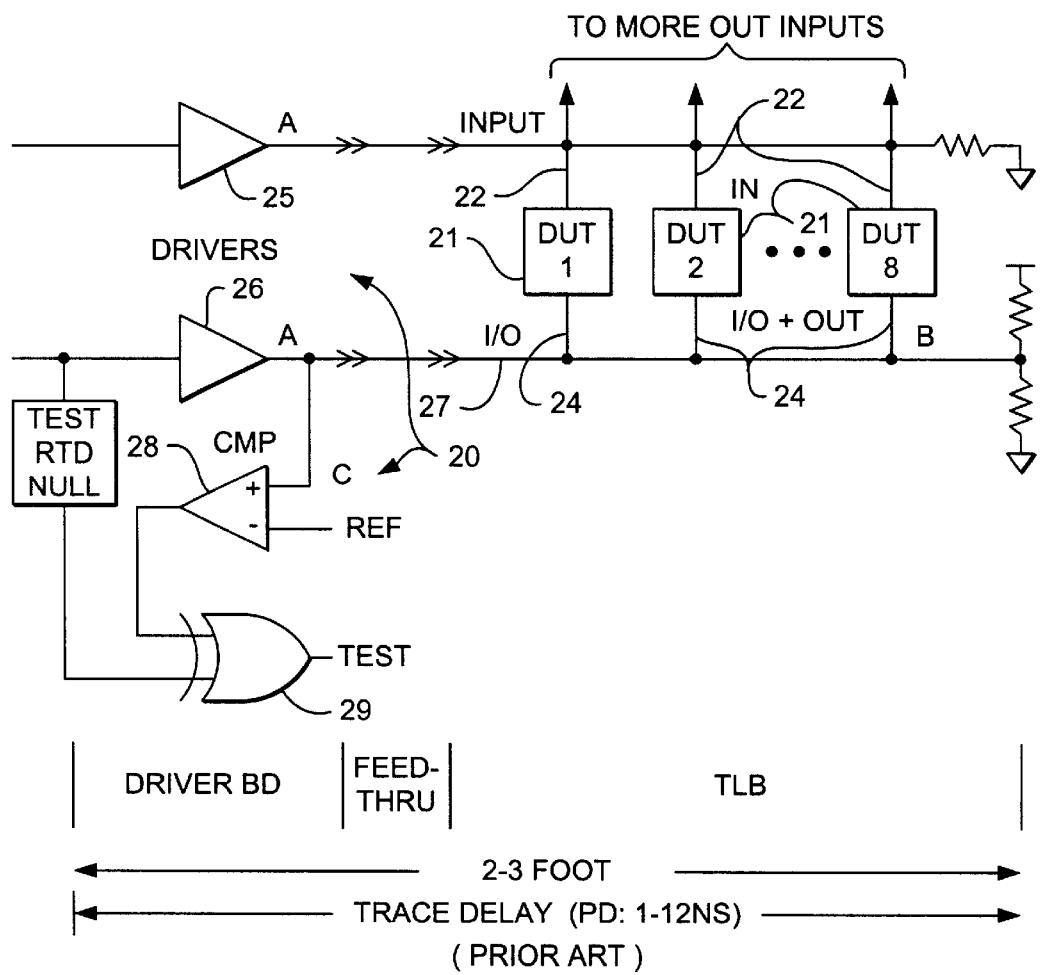
FIG. 2 illustrates prior art flyback testing on a burn-in-board with multiple Devices Under Test.
Figure 4:
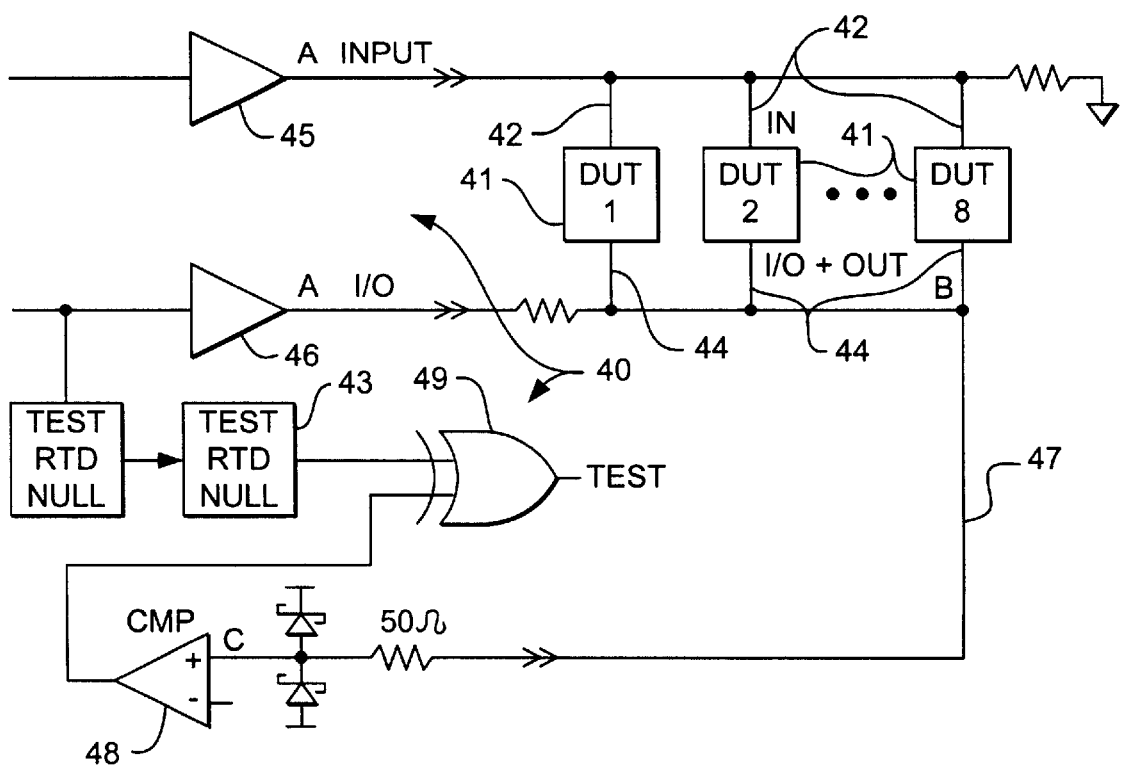
FIG. 4 illustrates a first embodiment of a portion of a burn-in system in accordance with the invention incorporating flyback testing on a burn-in-board with removal of trace RTD.

FIG. 4 illustrates flyback testing on a burn-in-board with multiple DUTs 41, which can be compared with the prior art method of testing used for burn-in boards shown in FIG. 2. A tester 40 connects to DUTs 41 to be tested at two interfaces/pins, such as 42 and 44. The tester input driver 45 connects to the DUT inputs as shown at 42, and the tester I/O driver 46 connects to the DUT I/O drivers as shown at 44. The input driver 45 produces a test data input signal periodically that is reproduced in state form as an output in the case of memories or, more generally, is a predetermined function of the input for other types of integrated circuits, at the data output of non-faulty DUTs. The typical physical trace line length between test drivers 45 and 46 and rows of DUTs 41 is 2–3 feet, and the propagation delay for these traces typically range from 7–12 nanoseconds (ns). The sum of the input and output delays equals the propagation delay, referred to as Round Trip Delay (typically 14–24 ns).

Tester input driver 45 typically will have more DUTs connected to it than will the tester I/O driver 46 and much better line termination. The tester I/O driver typically is connected to 8 different DUT I/O pins. The signal sent by that DUT is resistively isolated by an isolating resistor of about 100 ohms or greater to the I/O line of the driver, but a separate line 47 carries the DUT output to a series connection of a small value resistor and zener clipping diode pair comprising a z-clamp, and a comparator 48, and then to a latch 49. This configuration differs from the prior implementation described in FIG. 2 in that the input to the positive node of the comparator is taken directly from DUT outputs at B and not from a point very close to the tester I/O driver as indicated by 29 in FIG. 2. The change prevents the DUT output seen at the comparator from being cancelled out by the tester I/O driver turning on for the next test cycle.

The series resistor in 48 reduces ringing at the comparator in a conventional manner.

Figure 5A:
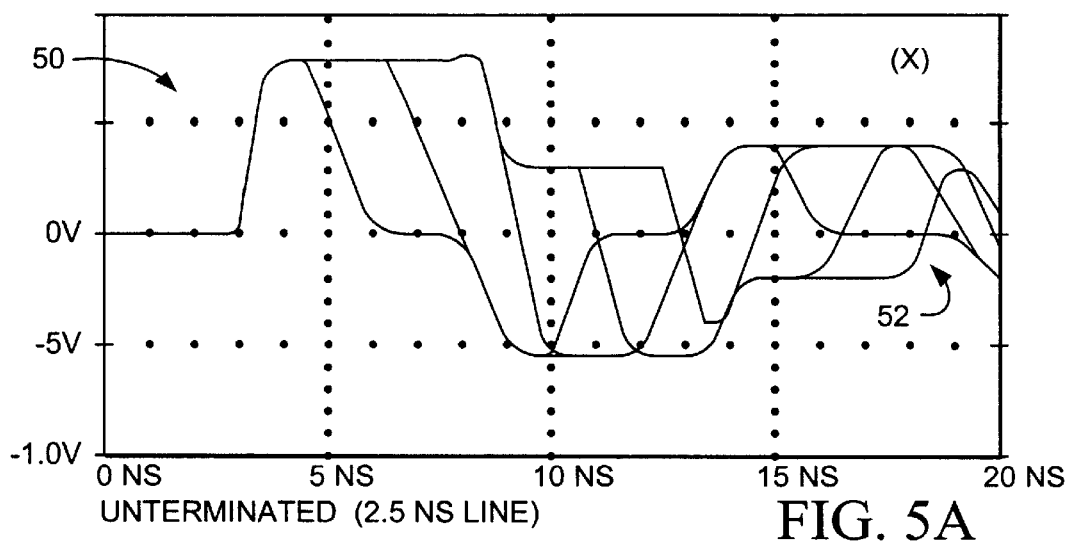
FIGS. 5A and 5B illustrate distortion on I/O lines in a flyback testing with varied terminations.
Figure 5B:
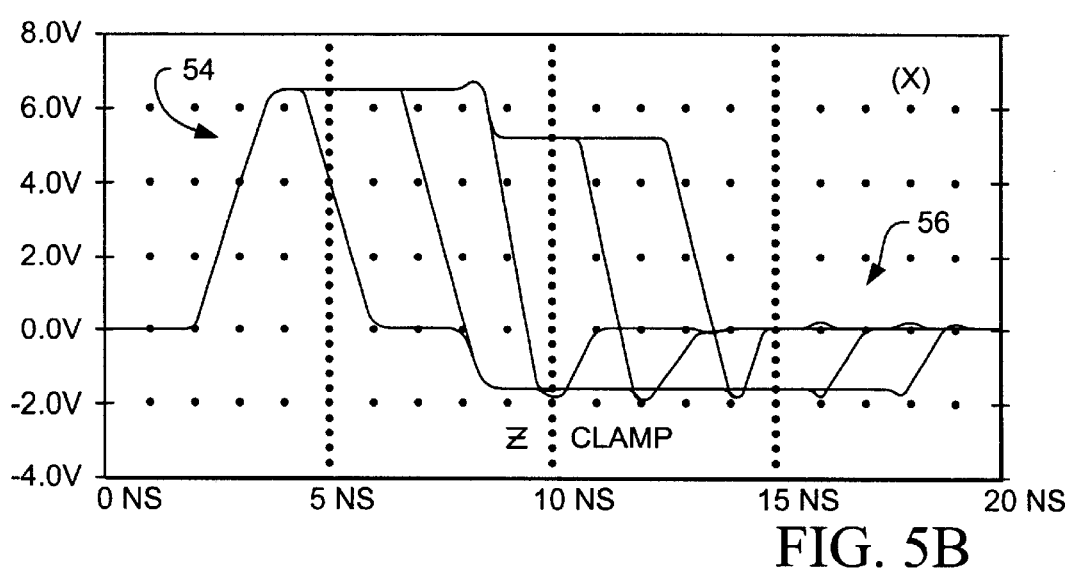

The z-clamp in 48 of FIG. 4 improves signal accuracy on long lines. This is shown in the graphs 50 and 54 of FIGS. 5A and 5B. Graph 50 depicts the voltage entering the comparator at 48 in FIG. 4 when the z-clamp is removed from that circuit. Graph 54 depicts the voltage seen at the comparator when the z-clamp is included as in FIG. 4. The graphs show that distortion (sinusoidal) is much smaller in magnitude when the z-clamp is included (56) than when it is not (52). Ideally, both signals on the right side ("trailing edge") of graphs 50 and 54 should be "flat", and clearly 56 is much "flatter" than 52. The more "flat" the signal is, the more effectively the comparator at 48 in FIG. 4 and the test logic 49 can determine whether the outputs from DUTs are correct.

Figure 3:
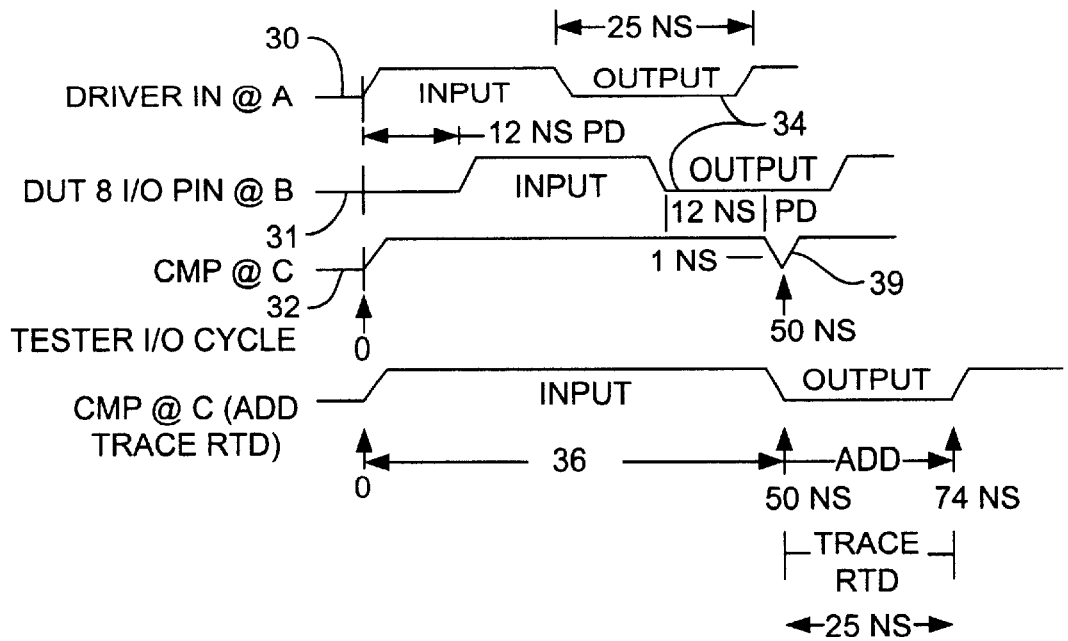
FIG. 3 shows a prior art timing diagram illustrating how signals propagate throughout the network of FIG. 2.
Figure 6:
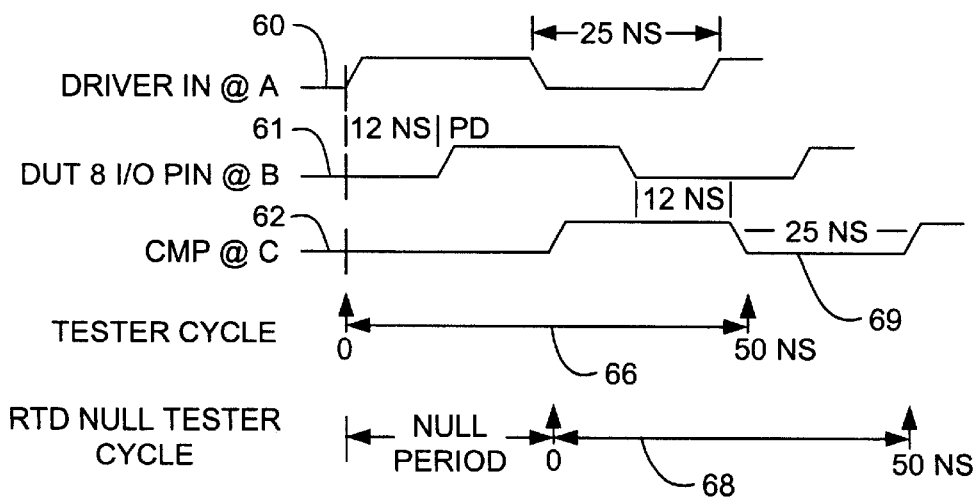
FIG. 6 shows a timing diagram illustrating how signals propagate throughout the network of FIG. 4.

FIG. 6 shows a timing diagram for FIG. 4 that is analogous to the timing diagram in FIG. 3. FIG. 6 shows a timing diagram illustrating how signals propagate through the testing network of FIG. 4. Each of the traces 60, 61, and 62 represent the signal level at the points labeled A, B, and C, respectively, in FIG. 4. Each of the vertical hash at the left of traces 60, 61, and 62 denote a time of zero nanoseconds.

Because the input to the comparator 48 at C is taken from a point B in the proximity of DUT output and not from a point in the proximity of the I/O tester driver 46 in the return loop and is taken from a path different from the tester I/O driver path, the low level output 69 from a DUT that propagates to C, the input to the comparator, is not cancelled out as in the circuit depicted in FIG. 2. In this manner, trace Round Trip Delay is eliminated.

Trace propagation delay, the time required for a signal to propagate from the test input 45 to DUTs 41, and equally to propagate along line 47 between DUT outputs at B and the circuitry 48, can be eliminated or "nulled out." This is accomplished by delaying or shifting the 50 nanosecond tester cycle 66 with a delay equal to RTD time as shown in 68. This is accomplished through the TRACE RTD NULL circuitry 43 in FIG. 4. In this manner, the input to the comparator at C in FIG. 4 is only used for testing by 49 between the times indicated by the arrows labeled "0" and "50 ns" in 68. As FIG. 6 shows, examining the signal at C during this period exactly captures the high and low level output pulse widths from DUTs without the interference depicted by the pulse 39 in FIG. 3.

Figure 7:
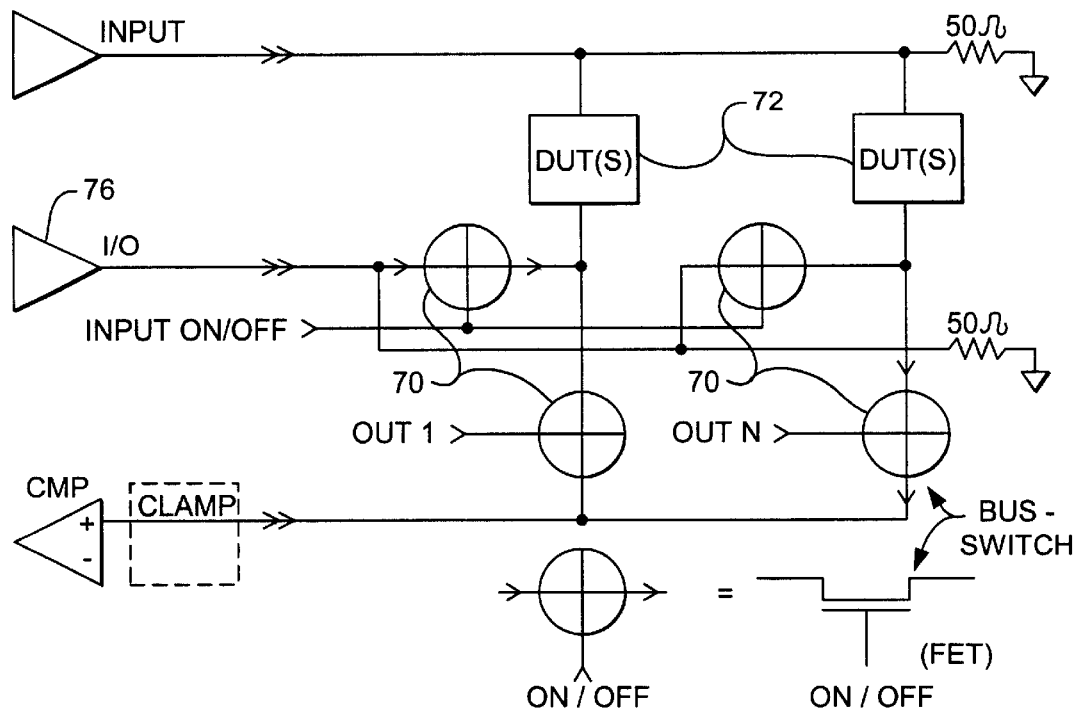
FIG. 7 illustrates a second embodiment of a portion of a burn-in system in accordance with the invention incorporating the use of bus-switches in testing DUTs.

FIG. 7 depicts additional enhancements of the circuit in FIG. 2 which improve testing speed and performance. FIG. 7 shows bus-switches 70 connected to the outputs of DUTs 72. These switches reduce trace line length when the DUTs 72 output signals for testing by switching off connection to the tester I/O driver 76. This increases possible testing speeds by reducing capacitance loading and eliminating long input line trace. It also reduces capacitance loading on DUT input/output pins, allowing DUTs capable of driving only relatively small capacitances to be tested when they otherwise would not be able to be tested. The bus switches 70 also provide proper termination for tester I/O driver 76 when it is in the input mode. Other than as shown and described, the construction and operation of the FIG. 7 embodiment of the invention is the same as that of the FIG. 4 embodiment.

Figure 8:
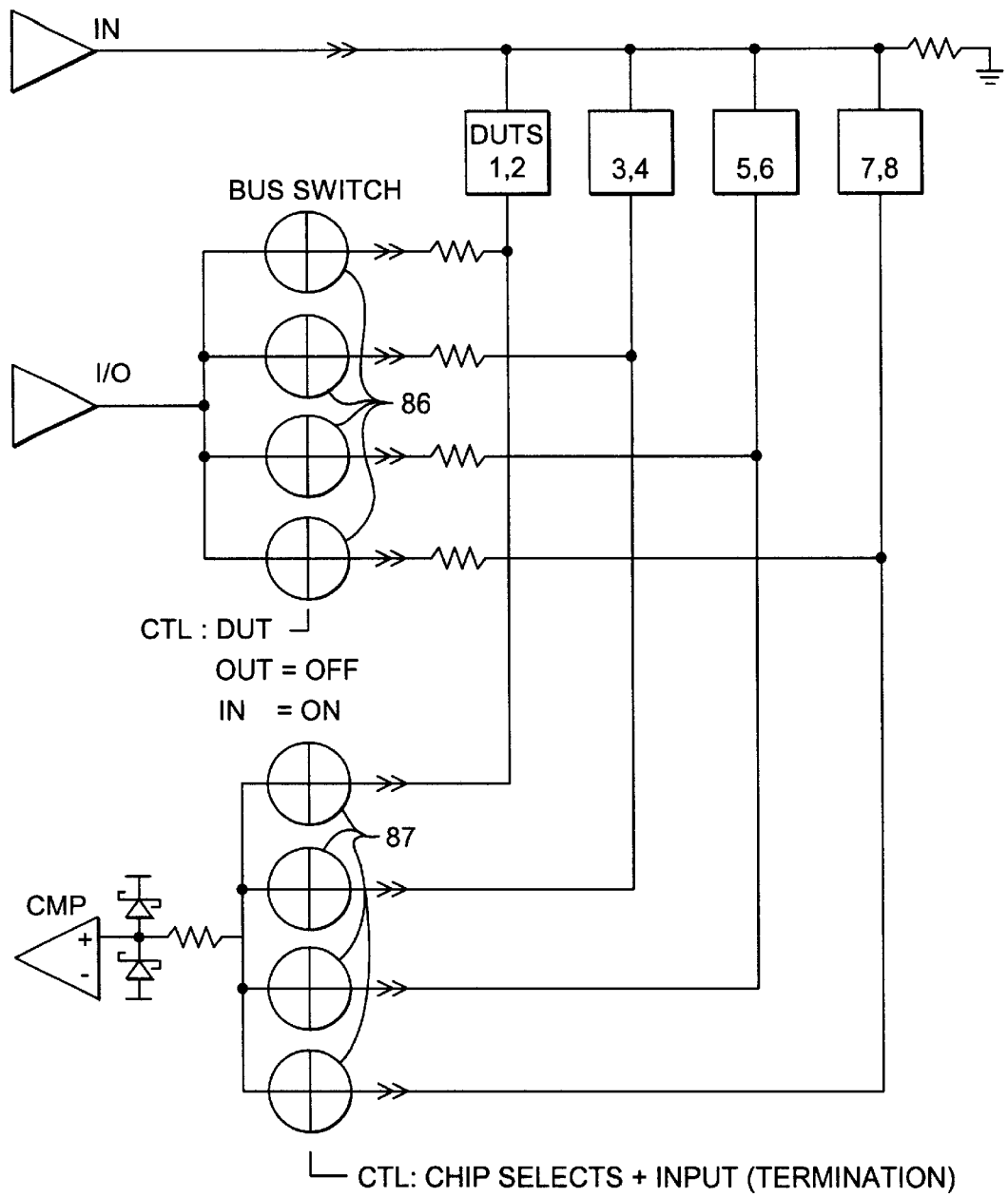
FIG. 8 illustrates a third embodiment of a portion of a burn-in system in accordance with the invention incorporating the use of multiple bus-switches in testing multiple pairs of DUTs.

FIG. 8 depicts 8 bus-switches connected to 8 DUTs, as in FIG. 7, but each bus switch 86 and 87 is on the driver board side instead of the DTB side, as in the implementation in FIG. 7. Placing the bus switches on the DTB side as close to DUTs as possible (FIG. 7) enhances the advantages of bus-switch technology described previously but requires additional cooling or high temperature operating devices, since these are in the high temperature burn-in environment. By placing the bus-switches on the driver board side 88, this cooling problem is avoided. As in other implementations, series resistors are connected between DUTs and the tester I/O driver for tester driver I/O isolation when the DUT is in output mode. FIG. 8 also depicts reduced channel logic in comparison to FIG. 7, which can reduce testing cost. Other than as shown and described, the construction and operation of the FIG. 8 embodiment of the invention is the same as that of the FIGS. 4 and 7 embodiments.

Figure 9:
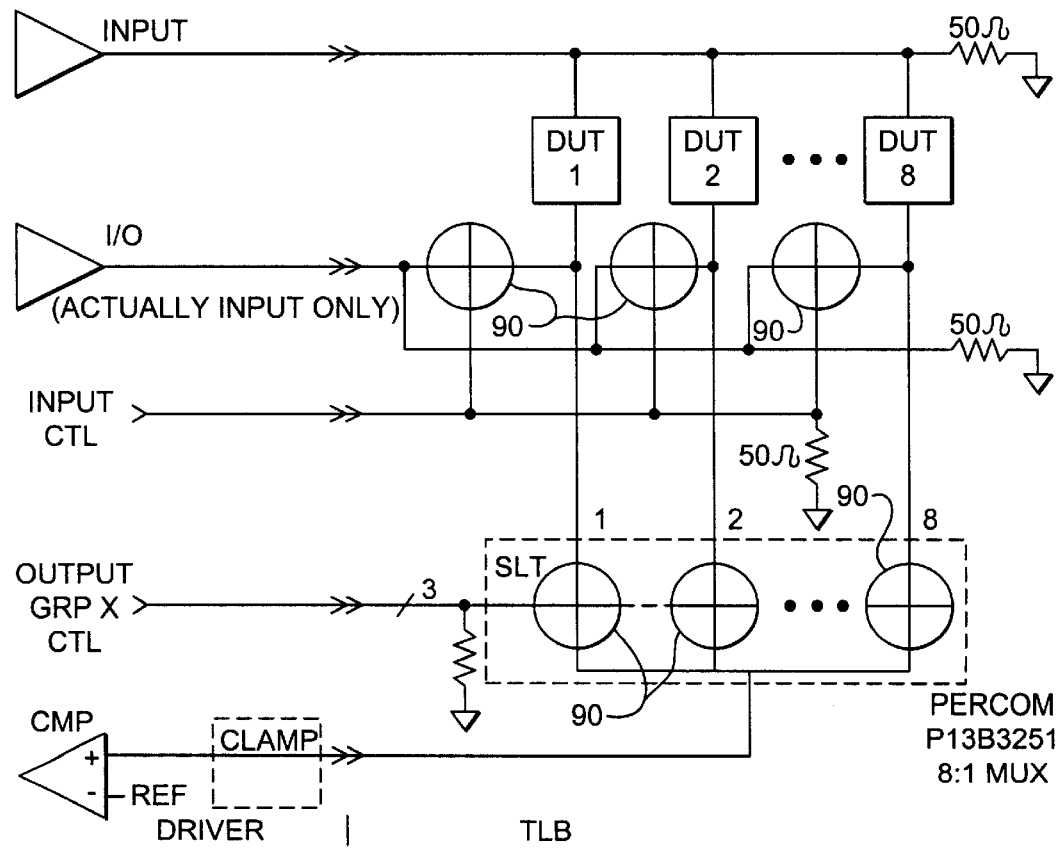
FIG. 9 illustrates a fourth embodiment of a portion of a burn-in system in accordance with the invention incorporating the use of bus-switches with mux/demux capability in testing multiple DUTs.

FIG. 9 depicts bus-switches with multiplexer/demultiplexer capability, which gives further reduction of pin capacitance for DUT output, which increases testing speed. The bus-switches 90 in FIG. 9 are on the DTB side of the testing configuration as in FIG. 7. Other than as shown and described, the construction and operation of the FIG. 9 embodiment of the invention is the same as that of the FIGS. 4, 7 and 8 embodiments.

Figure 10:
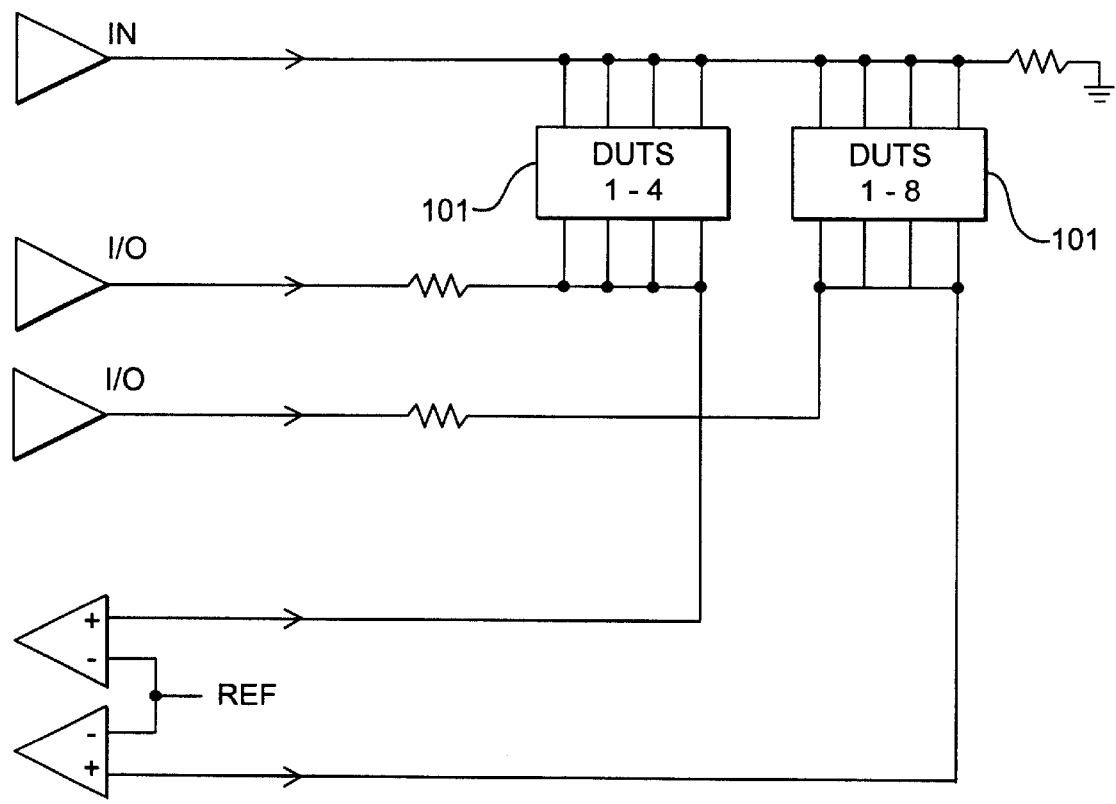
FIG. 10 illustrates a fifth embodiment of a portion of a burn-in system in accordance with the invention incorporating reducing the number of DUTs per I/O test channel to increase testing speed.

FIG. 10 depicts a testing configuration in which four DUTs 101 are connected to each I/O test driver instead of eight DUTs 41 per I/O test driver as depicted in FIG. 4. The reduction in DUTs per test driver reduces capacitance on trace lines and the number of trace stubs seen by each test driver. Trace stubs are short branches connecting DUT pins to main traces on the burn-in board. Ideally, the main traces are routed to eliminate trace stubs, but in practice, not all of them can be eliminated. Reducing the number of DUTs per test driver means that the number of trace stubs per test driver is also reduced. These changes increase maximum testing speed. Other than as shown and described, the construction and operation of the FIG. 10 embodiment of the invention is the same as that of the FIGS. 4, 7, 8 and 9 embodiments.

Figure 11:
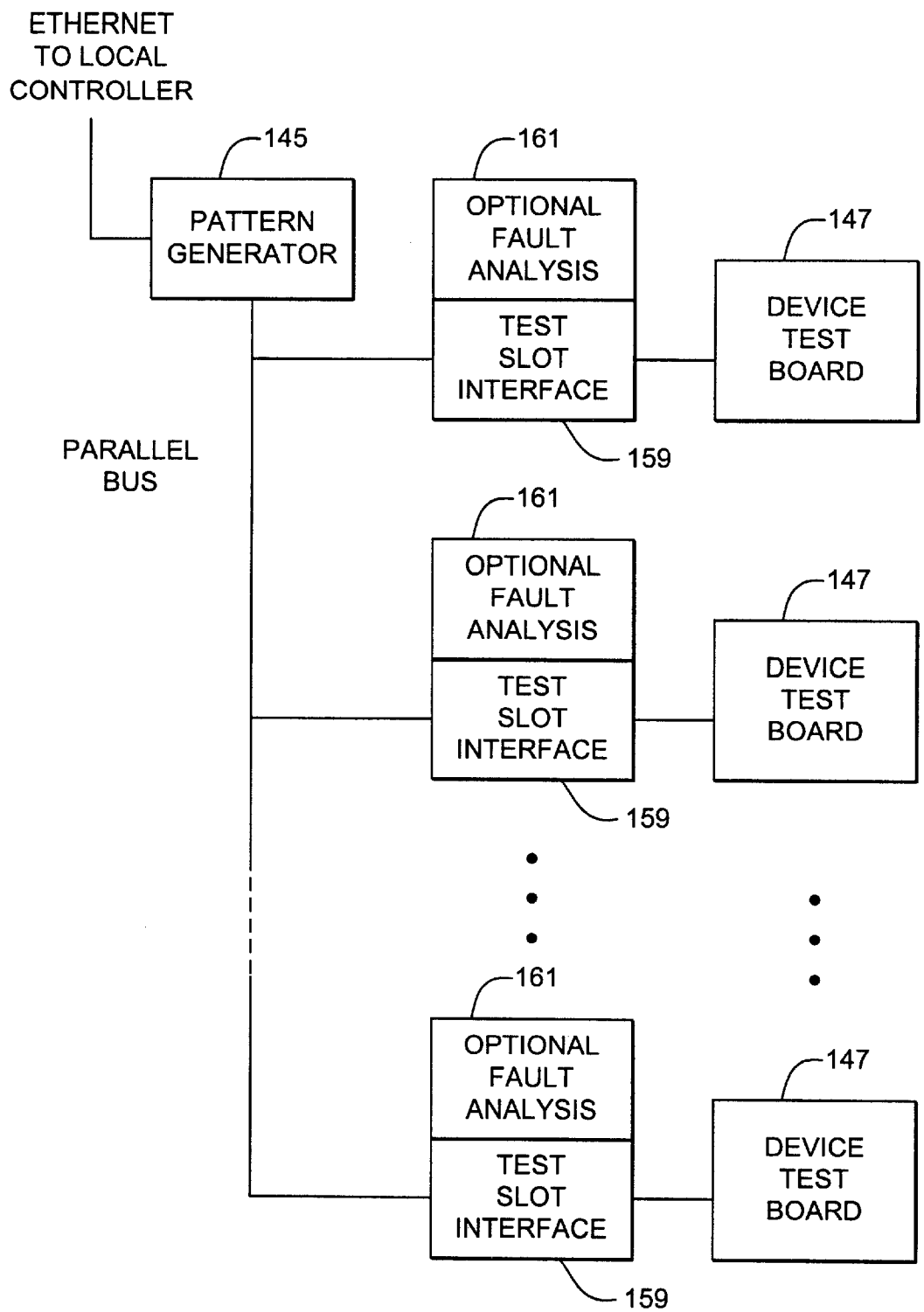
FIG. 11 is a generalized block diagram of a burn-in system in accordance with the invention.

The system portions of the FIGS. 4, 7, 8, 9 and 10 embodiments are incorporated in a burn-in system as shown in FIG. 11. As shown in FIG. 11, each slot in a zone has a slot interface 159 and can include optional fault analysis 161. The pattern generator 145 is algorithmic and is capable of generating N, $N^{3/2}$, and $N^2$ patterns. The test slot interface or driver board 159 includes DUT power supplies, signal drivers, data output comparators and pass/fail logic. The device test board 147 and test slot interface for each slot incorporates a system portion as shown in FIGS. 4, 7, 8, 9 or 10. Other than as shown and described, the construction and operation of the system of FIG. 11 is the same as shown and described in the above referenced Brehm et al. patent.

It should further be apparent to those skilled in the art that various changes in form and details of the invention as shown and described may be made. It is intended that such changes be included within the spirit and scope of the claims appended hereto.

What is claimed is:

1. A semiconductor device parallel test and burn-in system, which comprises:

a pattern generator for generating a plurality of test signals for the semiconductor devices;

an interface for coupling a plurality of semiconductor devices in parallel to said pattern generator; and a plurality of data output comparators coupled to said interface so that one of said plurality of data output comparators can be coupled to each of said plurality of semiconductor devices;

where said interface and said data output comparators are coupled to substantially eliminate round trip delay.

2. The semiconductor device burn-in system of claim 1 in which said interface and said plurality of data output comparators are coupled to substantially eliminate round trip delay by providing one of said data output comparators having an input adjacent to a separate test output connection of each of said plurality of semiconductor devices under test.

3. A semiconductor device parallel test and burn-in system, which comprises:

a pattern generator for generating a plurality of test signals for the semiconductor devices; an interface for coupling a plurality of semiconductor devices in parallel to said pattern generator; and a plurality of data output comparators coupled to said interface so that one of said plurality of data output comparators can be coupled to each of said plurality of semiconductor devices;

where said interface and said data output comparators are coupled to substantially eliminate round trip delay by providing one of said data output comparators having an input adjacent to a separate test output connection of each of said plurality of semiconductor devices under test;

said system further comprising a diode clamp connected between the test output connection of each of said plurality of semiconductor devices under test and said data output comparator.

4. A semiconductor device parallel test and burn-in system, which comprises:

a pattern generator for generating a plurality of test signals for the semiconductor devices;

an interface for coupling a plurality of semiconductor devices in parallel to said pattern generator; and a plurality of data output comparators coupled to said interface so that one of said plurality of data output comparators can be coupled to each of said plurality of semiconductor devices;

where said interface and said data output comparators are coupled to substantially eliminate round trip delay by providing one of said data output comparators having an input adjacent to a separate test output connection of each of said plurality of semiconductor devices under test;

said system further comprising a first output bus switch connected between the test output connection of each of said plurality of semiconductor devices under test and said data output comparator.

5. The semiconductor device parallel test and burn-in system of claim 4 additionally comprising a tester input/output driver capable of being driven in an input mode and an output mode coupled between said pattern generator and the test output connection of each of said plurality of semiconductor devices under test through a second output bus switch.

6. The semiconductor device parallel test and burn-in system of claim 5 in which said first output bus switch comprises a first field effect transistor.

7. The semiconductor device parallel test and burn-in system of claim 6 in which said second output bus switch comprises a second field effect transistor.

8. The semiconductor device parallel test and burn-in system of claim 7 in which said first and second field effect transistors are provided in said interface and said device parallel test and burn-in system additionally includes at least one semiconductor device test board connected to said interface and including the plurality of semiconductor devices under test.

9. The semiconductor device parallel test and burn-in system of claim 7 in which said device parallel test and burn-in system additionally includes at least one semiconductor device test board connected to said interface and including the plurality of semiconductor devices under test, said first and second field effect transistors being provided in said semiconductor device test board.

10. The semiconductor device parallel test and burn-in system of claim 9 in which said first field effect transistor is provided in a multiplexer circuit between the plurality of semiconductor devices under test and said data output comparator.

11. A semiconductor device parallel test and burn-in system, which comprises:
    a pattern generator for generating a plurality of test signals for the semiconductor devices;
    an interface for coupling a plurality of semiconductor devices in parallel to said pattern generator; and
    a plurality of data output comparators coupled to said interface so that one of said plurality of data output comparators can be coupled to each of said plurality of semiconductor devices;
        where said interface and said data output comparators are coupled to substantially eliminate round trip delay; and
        where one of said plurality of data output comparators is coupled to each of the plurality of semiconductor devices through a multiplexer.

12. A method for burn-in testing of a plurality of semiconductor devices, which comprises:
    providing a plurality of burn-in test signals to an input of each of the plurality of semiconductor devices;
    coupling a data output comparator to an output of each of the plurality of semiconductor devices in a manner to substantially eliminate round trip delay; and
    providing data output signals from each of the plurality of semiconductor devices to the data output comparator.

13. The method for burn-in testing of claim 12 in which the data output comparator is coupled to substantially eliminate round trip delay by providing the data output comparator having an input adjacent to a separate test output connection of each of said plurality of semiconductor devices under test.

14. The method for burn-in testing of claim 13 additionally comprising:
    connecting a diode clamp between the test output connection of each of the plurality of semiconductor devices under test and the data output comparator.

15. The method for burn-in testing of claim 13 additionally comprising:
    connecting a first output bus switch between the test output connection of each of the plurality of semiconductor devices under test and the data output comparator.

16. The method for burn-in testing of claim 15 additionally comprising:
    connecting a tester input/output driver capable of being driven in an input mode and an output mode between said pattern generator and the test output connection of each of said plurality of semiconductor devices under test through a second output bus switch.

17. The method for burn-in testing of claim 16 in which the first output bus switch comprises a first field effect transistor.

18. The method for burn-in testing of claim 17 in which the second output bus switch comprises a second field effect transistor.

19. The method for burn-in testing of claim 18 in which the first field effect transistor is provided in a multiplexer circuit between the plurality of semiconductor devices under test and the data output comparator.

20. The method for burn-in testing of claim 12 in which the one of said plurality of data output comparators is coupled to each of the plurality of semiconductor devices through a multiplexer.

* * * * *